United States Patent [19]

Vu et al.

[11] Patent Number: 5,578,865
[45] Date of Patent: Nov. 26, 1996

[54] REDUCTION OF PARASITIC EFFECTS IN FLOATING BODY MOSFETS

[75] Inventors: Duy-Phach Vu, Taunton; Ngwe K. Cheong, Boston, both of Mass.

[73] Assignee: Kopin Corporation, Taunton, Mass.

[21] Appl. No.: 426,875

[22] Filed: Apr. 24, 1995

Related U.S. Application Data

[62] Division of Ser. No. 153,781, Nov. 16, 1993, Pat. No. 5,420,055, which is a continuation of Ser. No. 823,858, Jan. 22, 1992, abandoned.

[51] Int. Cl.⁶ .................................................. H01L 29/167
[52] U.S. Cl. ........................ 257/611; 257/74; 257/610; 257/612; 257/617; 257/349
[58] Field of Search .................................. 257/376, 617, 257/609–612, 72, 349

[56] References Cited

U.S. PATENT DOCUMENTS

| | | | |
|---|---|---|---|
| 3,963,857 | 2/1976 | Ota | 174/84 C |
| 4,137,103 | 1/1979 | Mader et al. | 148/33 |
| 4,509,990 | 4/1985 | Vasudev | 257/53 |
| 4,617,160 | 10/1986 | Belanger et al. | 264/40.1 |
| 4,656,493 | 4/1987 | Adler et al. | 257/376 |
| 4,683,645 | 8/1987 | Naguib et al. | 437/41 |
| 4,753,895 | 6/1988 | Mayer et al. | 437/21 |
| 4,775,641 | 10/1988 | Duffy et al. | 257/349 |
| 4,835,112 | 5/1989 | Pfiester et al. | 437/24 |
| 4,871,690 | 10/1989 | Holonyak, Jr. et al. | 257/617 |
| 4,885,052 | 12/1989 | Fan et al. | 117/8 |
| 4,914,491 | 4/1990 | Vu | 257/260 |
| 4,922,315 | 5/1990 | Vu | 257/507 |
| 5,008,723 | 4/1991 | van der Have | 257/386 |
| 5,145,794 | 9/1992 | Kase et al. | 437/24 |

FOREIGN PATENT DOCUMENTS

| | | | |
|---|---|---|---|
| 2578096A | 8/1986 | France . | |
| 57-99778 | 6/1982 | Japan | 257/349 |
| 58-162067 | 9/1983 | Japan . | |
| 58-162067 | 9/1983 | Japan . | |
| 59-55070 | 3/1984 | Japan . | |
| 60-143666 | 7/1985 | Japan | 257/349 |
| 60-233857 | 11/1985 | Japan . | |
| 2-54523 | 2/1990 | Japan . | |

OTHER PUBLICATIONS

Sze, S. M.; *Physics of Semiconductor Devices*; 1981; p. 21.
Colinge, J. P., "This–Film SOI Devices: A Perspective," *Microelectronic Engineering* 8, (1988) pp. 127–147.
Hanafi, H. I., "Device Advantages of DI–LDD/LDD MOSFET Over DD MOSFET," *IEEE Circuits and Devices Magazine*, (Nov. 1985) pp. 13–16.

*Primary Examiner*—Jerome Jackson, Jr.
*Assistant Examiner*—John Guay
*Attorney, Agent, or Firm*—Hamilton, Brook, Smith & Reynolds, P.C.

[57] ABSTRACT

A semiconductor fabrication method improves the voltage characteristic of floating-body MOSFETs by creating recombination centers near the source-body junction of the device. A MOSFET is fabricated through the passivation oxidation stage, and a photolithography step is used to expose the source region. Implantation is then performed using one of two types of material. A first type creates electron traps of predetermined energy in the vicinity of the source-body junction. A second type creates defects in the crystalline structure of the semiconductor material. Both implantation types create recombination centers in the material. This allows the discharge through the source-body junction of charges built up in the body region.

12 Claims, 5 Drawing Sheets

REDUCTION OF PARASITIC EFFECTS IN FLOATING BODY MOSFETS

This application is a division of application Ser. No. 08/153,781 filed Nov. 16, 1993, now U.S. Pat. No. 5,420,055, which is a File Wrapper Continuation application of Ser. No. 07/823,858 filed Jan. 22, 1992, now abandoned.

BACKGROUND OF THE INVENTION

Silicon-on-insulator (SOI) materials offer potential advantages over bulk materials for the fabrication of high performance integrated circuits. Dielectric isolation and reduction of parasitic capacitance improve circuit performance, and eliminate latch-up in CMOS circuits. Compared to bulk circuits, SOI is more resistant to radiation. For example, silicon-on-sapphire (SOS) technology has been successfully used for years to fabricate radiation-hardened CMOS circuits for military applications.

Circuit layout in SOI can be greatly simplified and packing density largely increased if the devices are made without body contacts (i.e. the body region of these devices is kept floating). However, using available SOI material, partially-depleted MOSFETs typically exhibit parasitic effects due to the floating body. The most common of these are the "kink" effect and the "bipolar" effect, which are described in detail below. The partially-depleted devices are such that the maximum depletion width in the body is smaller than the thickness of the Si layer, and a quasi-neutral region results which has a floating potential.

A MOSFET includes a lateral bipolar transistor. FIG. 1 shows a typical n-channel MOSFET with a floating body 20. The n-p-n construction of the device illustrates the structure of a bipolar device. With the channel region 22 of the device partially depleted and a high drain voltage applied, the electric field created in the device causes impact ionization such that electrons and holes are generated near the drain 26. The generated holes are injected into the body thereby creating a positively charged body. The first consequence of this positive charge accumulated in the body 20 is the increase of the body potential resulting in a decrease of the threshold voltage of the MOSFET. Since the body potential increase is dependent upon drain voltage, the variation of threshold voltage shows up as "kinks" in the output characteristics of the device. FIG. 2 is a plot of the output characteristics of a floating-body SOI MOSFET device which demonstrate this effect at "kinks" 10. The curves represent the drain current $I_D$ as a function of drain voltage $V_D$ at different gate voltages ($V_G$=0, 1, 2, ... 7 volts). The device width to length ratio is W/L=201/101.

The second consequence of the voltage increase is the eventual turn-on of the bipolar device. As the body of the MOSFET becomes positively-biased, the source-body junction (emitter-base) becomes forward-biased, and electrons are injected from the source into the body region. Those injected electrons reaching the drain (collector) depletion region add to the drain current. Thus, control of the current through the device using the MOS gate 30 is lost. This effect is referred to as the parasitic bipolar effect.

Therefore, a need exists for a MOSFET having reduced parasitic effects and providing the circuit performance necessary for integrated circuit applications including those employing CMOS circuits.

SUMMARY OF THE INVENTION

The present invention provides a method of fabricating a floating-body semiconductor MOSFET in which parasitic kink and bipolar effects are greatly reduced. These effects are of particular importance in n-channel MOSFETs where they result in a more substantial degradation of device performance. The vehicle through which the improvement is made is the intentional formation of recombination centers in the form of defects adjacent to the source/body (emitter/base) junction of the device. These recombination centers reduce the charge build-up which results from impact ionization by facilitating the recombination of electrons and holes, and in effect discharging any charge build-up in the body of the device.

These parasitic effects are important only for n-channel devices due to the ionization rate for holes which is one-to-two orders of magnitude smaller than the one for electrons. In the present invention, a method of fabricating a floating-body semiconductor MOSFET device involves providing a semiconductor material and fabricating a source region of a first conductivity type (typically n-type) in the semiconductor material. A channel region of a second conductivity type is also fabricated in the material adjacent the source region such that a p-n junction is formed between the source region and the channel region. An implantation procedure is then performed in which material is implanted near the conductivity (p-n) junction which causes the formation of a relatively high concentration of recombination centers where electrons and holes can recombine. Following the implantation, the semiconductor material is annealed in a relatively low temperature process performed in the range of 400°–600° C. and preferably at about 450° C.

The creation of the recombination centers can be accomplished in the present invention using one of several implantation procedures. In a first embodiment, material is implanted which creates electron traps. These electron traps are at known energy levels within the bandgap of the material. A particularly good material for creating these electron traps is sulfur. In a second embodiment, material is implanted to create in the vicinity of the p-n junction defects in the crystalline structure of the semiconductor material. Good materials for this type of implantation include silicon or germanium. The implantation of these materials creates the desired defects in the semiconductor material.

Both of the above embodiments of the present invention achieve a similar result in that they allow the discharge of built-up of holes in the channel region. The present invention is particularly oriented toward floating-body devices, and in particular n-channel MOSFETs. The resulting transistor structures have an improved current voltage characteristic, and the disadvantages associated with the kink and bipolar parasitic effects are greatly alleviated.

The present invention is particularly useful in the use of arrays of transistors used for active matrix drive circuits for display panels such as those described in U.S. Ser. No. 07/636,602 filed on Dec. 31, 1990 the contents of which are incorporated herein by reference.

DETAILED DESCRIPTION OF THE PREFERRED EMBODIMENTS

The present invention reduces the parasitic voltage potential build-up in the body region of an n-channel, floating-body transistor device. A fabrication method is used which includes an implantation step that creates recombination centers in the vicinity of the source-body junction. A preferred embodiment employs implantation during the latter stages of the device fabrication process, and the implanted species is activated with a low temperature anneal. The source-body junction is then "leaky" due to the presence of the recombination centers, and thus creates a path by which to evacuate the excess holes created during impact ionization without adversely effecting the leakage current of the MOSFET.

Figure 3A:
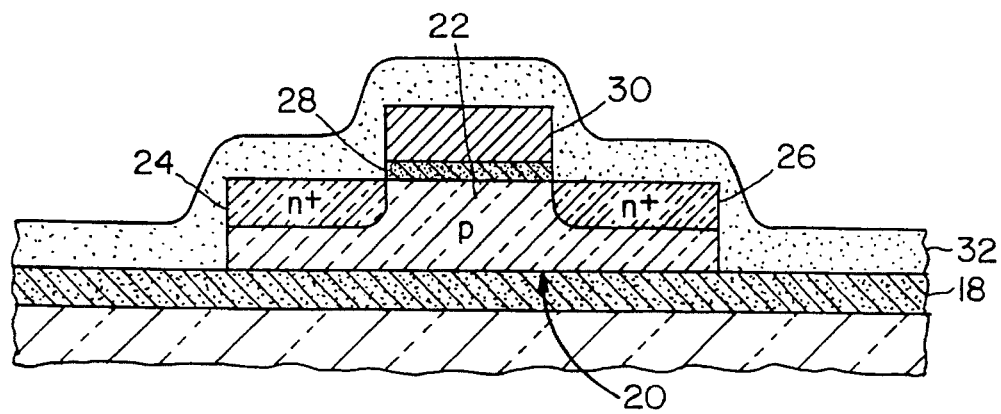
FIGS. 3A, 3B and 3C demonstrate the implantation procedure of the present invention.
Figure 3B:
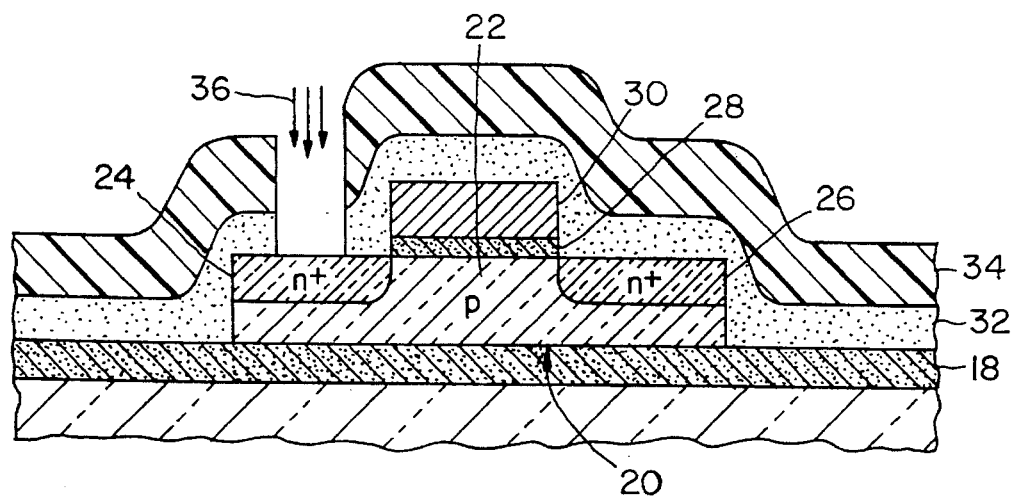
Figure 3C:
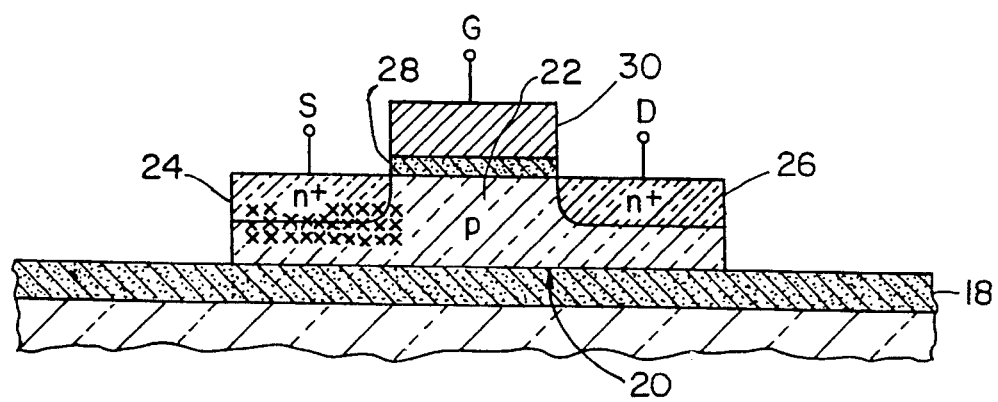

FIGS. 3A–3C illustrate the process flow steps for making a preferred embodiment of a floating-body, n-channel MOSFET structure in the latter stages of fabrication. In this preferred embodiment, the fabrication process used is a mesa isolation type process as is described in U.S. Pat. No. 4,922,315, the contents of which is incorporated herein by reference. Briefly, the steps of this process leading up to structure shown in FIG. 3A are as follows: 1) active area definition (mesa); 2) threshold voltage ($V_t$) adjustment (n- and p-channel); 3) gate oxidation; 4) gate definition; 5) source and drain implantation; 6) dopant activation; 7) passivation oxide deposition.

The structure of FIG. 3A illustrates a MOSFET structure resulting from a mesa isolation type fabrication process as referenced above. P-type doping in the body 20 of the silicon material provides the channel region 22 between source 24 and drain 26 (both n-type doped regions). Silicon body 20 resides on an insulating substrate 18 such as silicon dioxide ($SiO_2$). On the silicon body 20, gate oxide 28 is grown atop the channel region 22. Above the gate oxide 28 is gate 30. A passivation oxide 32 covers the entire device.

In a conventional mesa isolation fabrication process, the last two steps after the passivation oxide would be to open the contacts and metallized for making the interconnections. However, in the present invention the following steps are first performed on the structure of FIG. 3A. First, a photolithography step is used to expose a portion of the source area 24. A photoresist material 34 is applied to the structure shown in FIG. 3A, and a mask is applied except above the source region. After the photoresist 34 is etched away from above the source region, an oxide etch is used to strip the passivation oxide off the source area 24. This reveals the source area as shown in FIG. 3B.

Once the source area 24 is revealed, implantation is performed to create the desired recombination centers. The arrows 36 shown in FIG. 3B indicate the desired implantation direction. The implantation procedure of the present invention falls into one of two embodiments. A first embodiment of the implantation introduces deep-levels into the body of the device near the source-body junction. A second embodiment uses implantation to create crystalline defects in the semiconductor material.

In the first embodiment, deep level defects are produced by implanting an impurity such as sulfur. Sulfur is preferred because it introduces three electron traps with energies in the bandgap of 0.52 eV, 0.37 eV and 0.18 eV from the conduction band edge. In the present embodiment the sulfur implantation conditions are preferably about 130 Kev/5× $10^{11}$ cm$^{-2}$. The implanted sulfur is then activated and diffused by a low temperature treatment similar to a post-metallization anneal. The annealing time is chosen to diffuse the impurities into the metallurgical p-n junction. The preferred anneal conditions include use of a nitrogen atmosphere at or below 600° C. for one hour. The diffusion is carefully controlled in order to confine the sulfur to the region of the source-body junction. In particular, the sulfur should be kept away from the drain-body junction to avoid an increase in leakage current.

The implantation procedure of a second embodiment uses the implantation to induce crystalline defects into the region of the source-body junction. Some of the preferred materials for this type of implantation are silicon (Si) and germanium (Ge). Using ion bombardment, structural disorder is created in the silicon lattice. The energy used in the Si implantation is such that the defects are located in the body side (low doped material) near the source-body junction. The resulting crystalline defects consist mainly of loops. The imperfections in the crystal provide pathways for electron/hole recombination.

In each of the implantation embodiments above, the function of the implantation is to create local recombination centers in the vicinity of the source-body junction. The implantation is performed just prior to the metallization step of the MOSFET fabrication (after step seven of the fabrication steps listed above). Performing the steps of the present invention at this stage of the fabrication procedure is possible since only a low temperature anneal, which is defined for the purposes of this application as being in a range below 800° C. is required to activate the implanted species. Once the implantation and annealing is complete, the remaining steps of the fabrication are completed. The source, drain and gate regions of the device are exposed and the metallization procedure is performed to affix metal contacts to each of these regions. Any necessary interconnections are then made to finalize fabrication. As an alternative, the low temperature anneal to activate the implanted species may be implemented after the remaining processing steps are complete.

The floating body device of FIG. 3C has a much improved voltage characteristic due to the implantation procedure of the present invention. Both of the implantation embodiments discussed above produce similar results, and significantly reduce the "kink" effect and the "bipolar" effect found in conventional floating body MOSFETS.

Figure 3D:
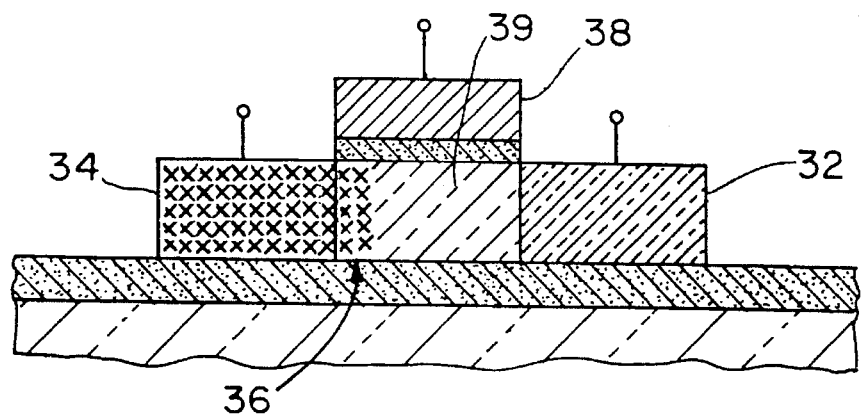
FIG. 3D illustrates another preferred embodiment of an n-channel floating body MOSFET that can be produced by the method set forth in FIGS. 3A–3C.

FIG. 3D illustrates another preferred embodiment of the invention where the source 34 and drain 32 regions extend down to the buried interface with the insulator. The annealing time is chosen to diffuse the impurities into the metallurgical p-n junction. Thus the recombination centers 36 generated by the implantation can extend throughout the source region 34 and into the channel region 37 and partially underlies the gate 38.

Figure 1:
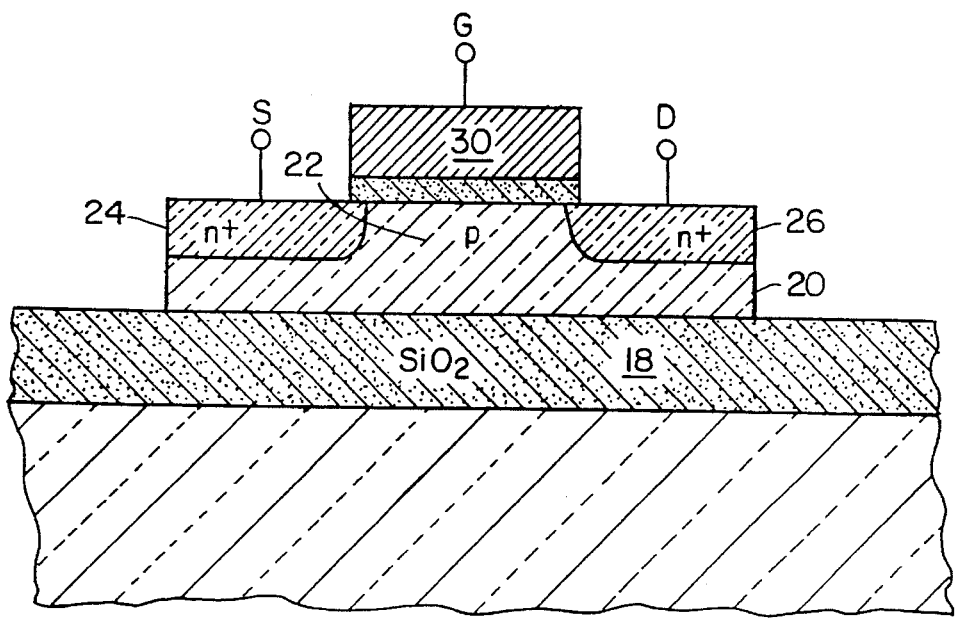
FIG. 1 illustrates the structure of a typical floating-body, n-channel MOSFET.
Figure 2:
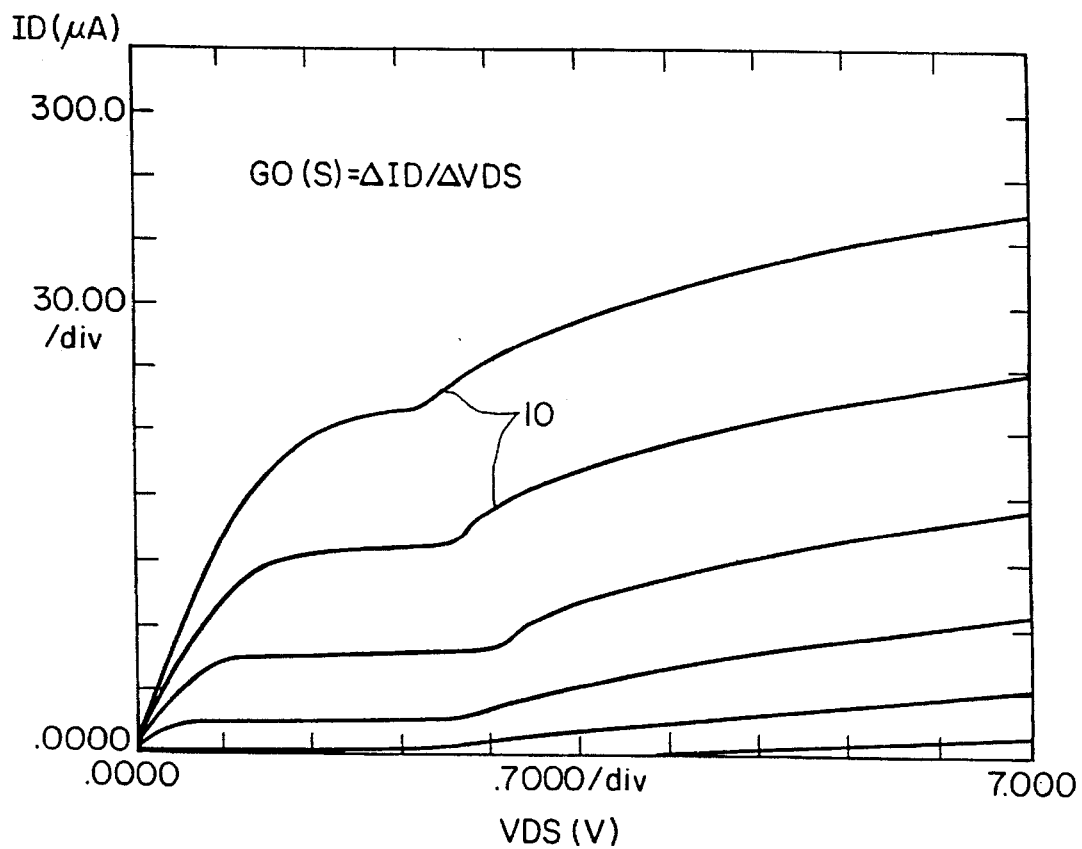
FIG. 2 is a voltage characteristic of a floating-body, n-channel MOSFET demonstrating the kink effect.
Figure 4A:
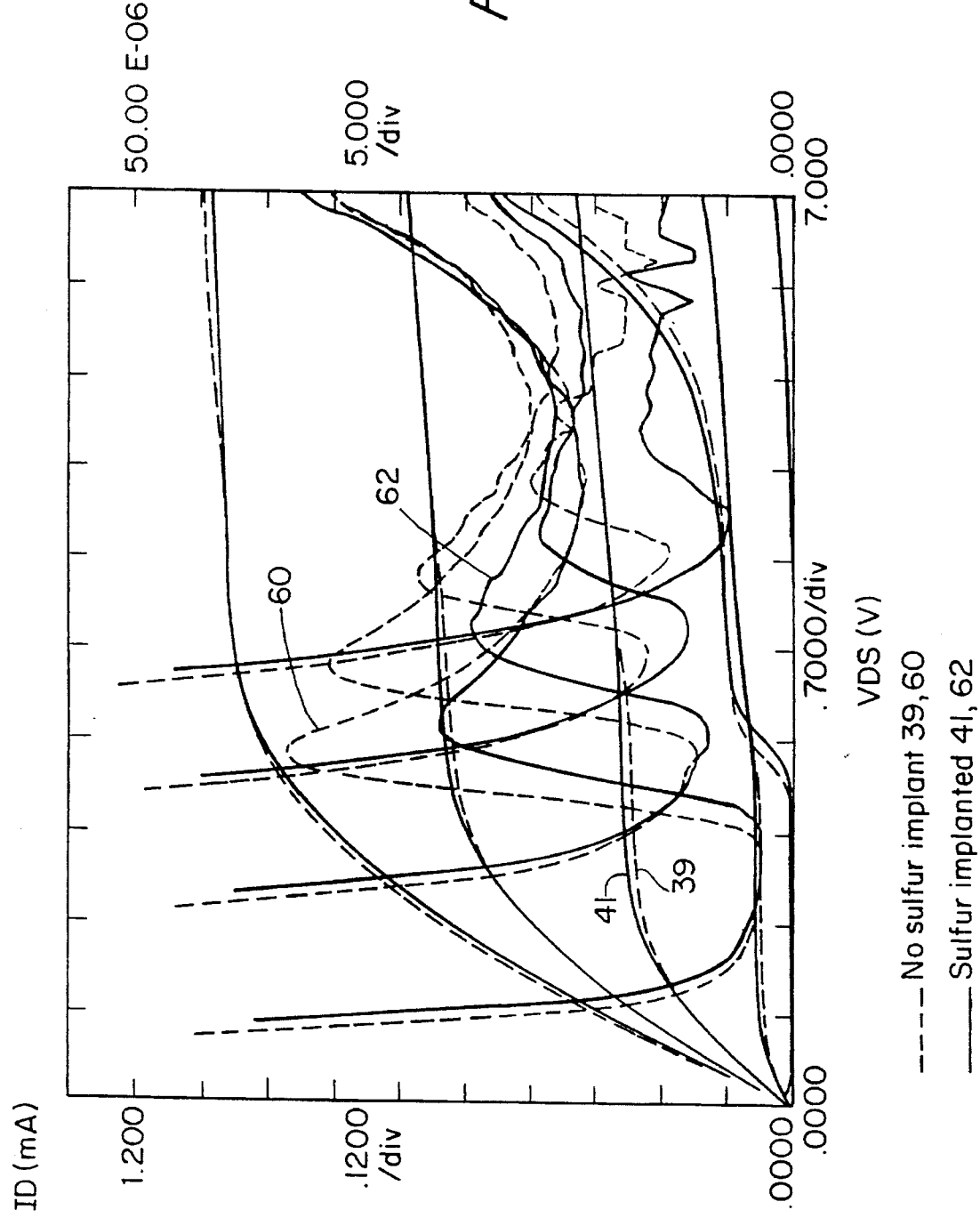
FIG. 4A illustrates the voltage characteristics and drain conductance of devices with sulfur implantation according to the present invention and without sulfur implantation.
Figure 4B:
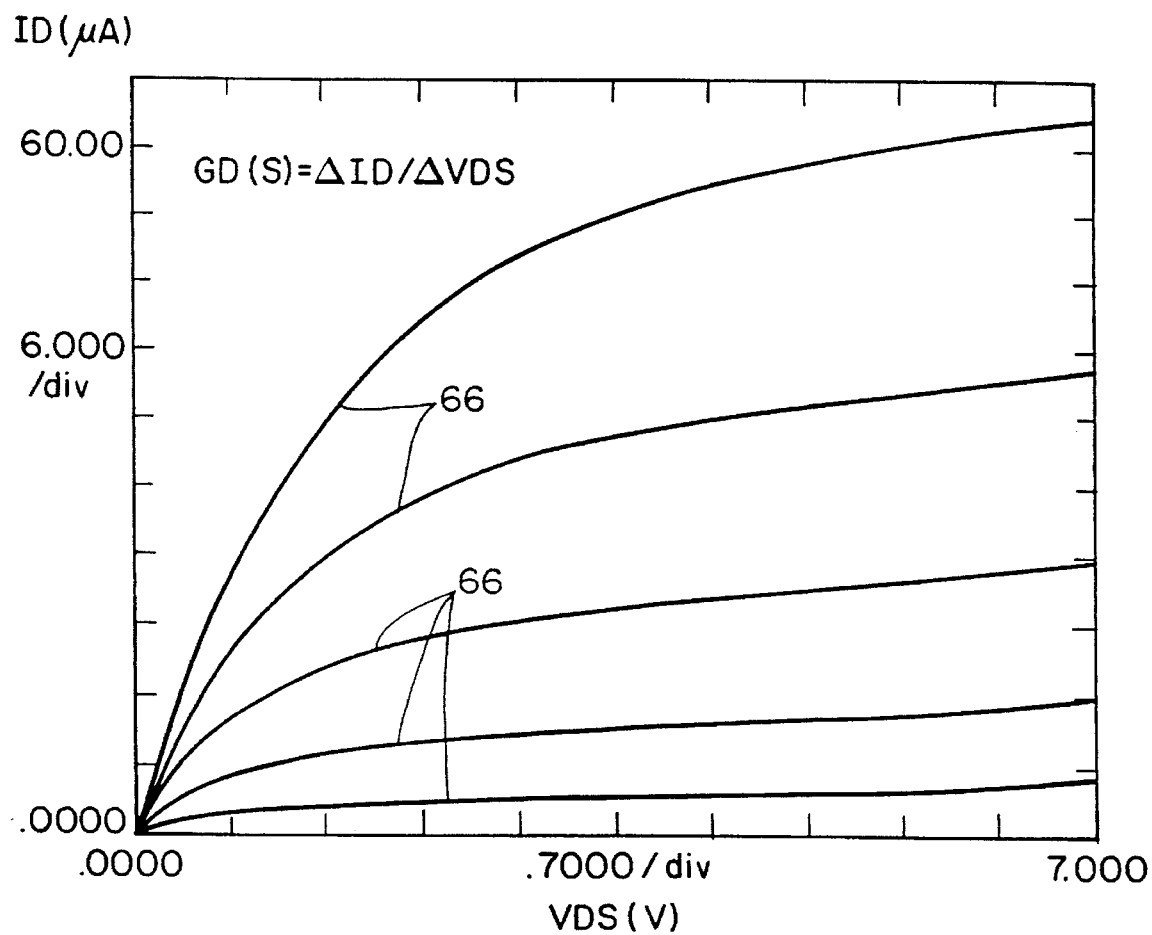
FIG. 4B illustrates the current –voltage characteristics of a device made in accordance with the invention using silicon implantation.

FIGS. 4A and 4B shows the measured output characteristics of two n-channel MOSFETs without body ties (i.e. without a floating body) fabricated in SOI material. Curve 39 (dashed lines) is the voltage characteristic of a MOSFET which did not receive a sulfur implant through the source region. Curve 41 (solid lines) is the voltage characteristic of a MOSFET which did receive a sulfur implant according to the present invention. As shown, kinks are greatly reduced in the sulfur-implanted device. Also plotted in FIG. 4A are the measured results of drain conductance $g_D$ measured for each of the tested MOSFETs. Drain conductance is expressed mathematically by the following equation:

$$g_D = dI_D/dV_D$$

where $V_G$ (gate voltage) is constant, $I_D$ is the drain current, and $V_D$ is the drain voltage. The drain conductance shows a peak on the occurance of a kink. Curve 60 (dashed lines) of FIG. 4A is the measured drain conductance for the MOSFET having no sulfur implantation. The peak height of the drain conductance for the sulfur implanted device shown by the solid lines 62 illustrates a substantial reduction in the kink. Curve 46 of FIG. 4B shows the voltage characteristic of a device implanted with silicon through the source area at a dose of $4 \times 10^{15}$ cm$^{-2}$ at 200 KeV and annealed in nitrogen at 700C. A comparison with the curve of FIG. 2 which was measured on an identically processed wafer without the silicon implantation shows a substantial reduction in the kink effect due to implantation.

Figure 5A:
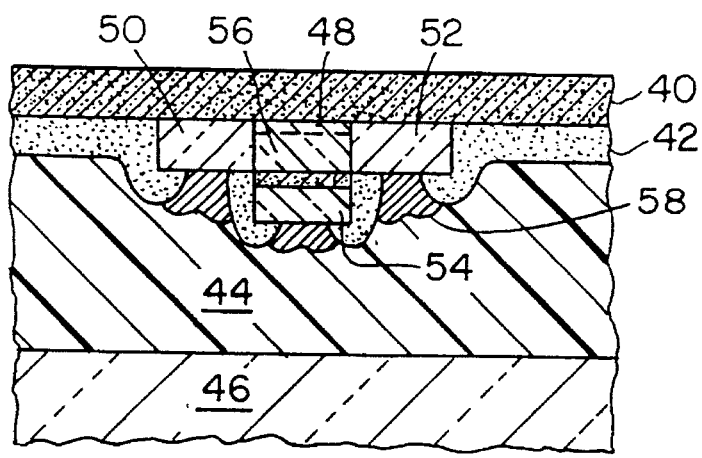
FIGS. 5A and 5B illustrate two embodiments the use of floating-body n-channel MOSFETS devices of the present invention as the pixel control circuit in a display panel.

FIG. 5A illustrates the use of the implanted transistor device that is part of a matrix of pixel control circuits in a display panel. The transistors of the array can be made in accordance with the process described in FIG. 3 and than attached to a glass substrate 46 using an epoxy 44 or other bonding agent. The source 50, drain 52, and gate contacts 54 are connected to drive circuitry for the panel by conventional means via metalization 58. A P$^+$ region 48 can be formed in the channel region 56. Oxide layers 40 and 42 are used to isolate adjacent pixel components. The processes described in FIGS. 3A-3D can be used to generate implanted regions in the device of FIG. 5A to reduce parasitic effects in display panel circuits both in the pixel circuitry and in the drive circuitry.

Figure 5B:
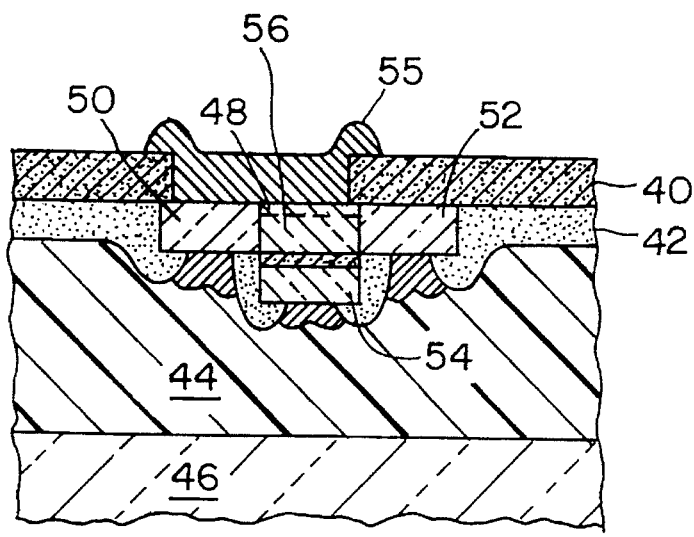

In FIG. 5B an alternative method is used to address the same problem. The oxide layer 40 can be patterned to expose the channel region and a metal 55 such as aluminum can be deposited and patterned to contact the channel region. As shown in FIG. 5B, the metal 55 covers the source 50 and channel 56 regions. This layer 55 can be extended to cover the entire device and is used as a light shield for the device. The metal 55 serves or provide means to electrically connect the source and the body to eliminate parasitic effects without the implantation step. The layer 55 further serves to substantially reduce the photogenerated leakage current.

Those skilled in the art will recognize that certain structural considerations in the fabrication procedure affect the extent to which a device is affected by the body potential build-up. For example, the amount of current generated by the bipolar effect depends upon several physical and electrical characteristics of the MOS device. The effective base width of the device is a function of the gate voltage, drain voltage and doping concentration while the current amplification factor (beta) is a function of the same parameters as well as the carrier lifetime. It will also be recognized that the bipolar and kink parasitic effects appear mainly in n-channel MOSFETs, and not p-channel devices. This is because the impact ionization coefficient of holes is two orders of magnitude lower than the coefficient for electrons at room temperature.

Those skilled in the art will also recognize that n-channel MOSFETs without body ties, fabricated in SOS and early SOI materials seldom suffered from the kink and bipolar effects. This is due to the short carrier lifetime inherent in these materials. In recent material produced by isolated silicon epitaxy (ISE™) techniques with carrier lifetimes in the 100 microsecond range, kinks and the the bipolar effect are a serious concern for devices without body ties. It will also be noted that in bulk technology, the body of the MOSFETs is always tied to the source.

While the invention has been particularly shown and described with reference to a preferred embodiment thereof, it will be understood by those skilled in the art that various changes in form and details may be made therein without departing from the spirit and scope of the invention as defined by the appended claims.

We claim:

1. A floating-body MOSFET device comprising:
    a channel region of a first conductivity type formed in a silicon thin film over an insulating layer;
    a source region of a second conductivity type adjacent the channel region in the silicon thin film such that a p-n junction exists between the source region and the channel region; and
    a high concentration of recombination centers in the silicon and underlying the p-n junction relative to a concentration of recombination centers at a second junction between a drain region and the channel region.

2. The floating-body MOSFET device of claim 1 further comprising sulfur implanted to create the recombination centers.

3. The floating-body MOSFET device of claim 1 wherein the recombination centers comprise electron traps of predetermined energy in the silicon bandgap.

4. The floating-body MOSFET device of claim 1 further comprising silicon implanted to create the recombination centers.

5. The floating-body MOSFET device of claim 1 wherein the recombination centers comprise structural or crystalline defects in the semiconductor material.

6. A floating-body n-channel MOSFET fabricated in a semiconductor material for a display panel comprising:
    a matrix of transistors each having n-type drain and source regions separated by a p-type channel region, the source region and the channel region forming a p-n junction such that there is a high concentration of recombination centers located in the vicinity of the p-n junction relative to a concentration of recombination centers at a second junction between the drain region and the channel region which facilitate the recombination of electrons and holes to prevent the build-up of charge in the channel region; and
    an optically transmissive substrate secured to the matrix of transistors with an adhesive layer.

7. The floating-body n-channel MOSFET of claim 6 wherein the matrix of transistors comprises an active matrix for a display panel.

8. The floating-body n-channel MOSFET of claim 6 wherein the matrix of transistors is positioned over a silicon dioxide layer.

9. The floating-body n-channel MOSFET of claim 6 wherein the optically transmissive substrate comprises glass.

10. The floating-body n-channel MOSFET of claim 9 wherein the adhesive comprises an epoxy.

11. The floating-body n-channel MOSFET of claim 6 further comprising a light shield over the array of transistors.

12. The floating-body n-channel MOSFET of claim 11 wherein the light shield comprises a metal layer over the channel region.

* * * * *